United States Patent
Nakakita et al.

(10) Patent No.: US 7,554,817 B2
(45) Date of Patent: Jun. 30, 2009

(54) INVERTER APPARATUS SUITABLE FOR BATTERY VEHICLE

(75) Inventors: Osamu Nakakita, Kanagawa-ken (JP);
Yoshimi Okazaki, Kanagawa-ken (JP);
Hiroyuki Yamazaki, Kanagawa-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 359 days.

(21) Appl. No.: 11/337,528

(22) Filed: Jan. 24, 2006

(65) Prior Publication Data
US 2006/0192509 A1 Aug. 31, 2006

(30) Foreign Application Priority Data
Feb. 25, 2005 (JP) ............... 2005-052002

(51) Int. Cl.
*H01R 9/00* (2006.01)
(52) U.S. Cl. .............. 361/775; 361/742; 174/138 D
(58) Field of Classification Search .......... 174/51, 174/138 D; 361/742, 758, 770, 775, 804
See application file for complete search history.

(56) References Cited

U.S. PATENT DOCUMENTS

| | | | | |
|---|---|---|---|---|
| 4,218,724 A | * | 8/1980 | Kaufman | 361/736 |
| 4,969,065 A | * | 11/1990 | Petri | 361/804 |
| 5,825,107 A | * | 10/1998 | Johnson et al. | 310/64 |
| 5,914,577 A | * | 6/1999 | Furnival | 318/538 |
| 6,166,937 A | * | 12/2000 | Yamamura et al. | 363/141 |
| 6,618,278 B2 | * | 9/2003 | Suzuki et al. | 363/144 |
| 7,375,287 B2 | * | 5/2008 | Rathmann | 174/260 |
| 2004/0100777 A1 | * | 5/2004 | Lee | 361/758 |

FOREIGN PATENT DOCUMENTS

JP 10-93220 A 4/1998

* cited by examiner

Primary Examiner—Jeremy C Norris
Assistant Examiner—Yuriy Semenenko
(74) Attorney, Agent, or Firm—Birch, Stewart, Kolasch & Birch, LLP

(57) ABSTRACT

An inverter apparatus is composed of an insulated metal substrate, a conductive stud, a printed circuit board, a conductive spacer, and a bus bar. An inverter output stage is mounted on the insulated metal substrate. The conductive stud is coupled to a main surface of the insulated metal substrate, and electrically connected with the inverter output stage. The printed circuit board is supported by the stud. The stud is coupled on the rear surface of the printed circuit board. Provided on the main surface of the printed circuit board is a circuit connected to the inverter output stage. The conductive spacer is coupled on the main surface of the printed circuit board, and electrically connected with the stud. The bus bar is coupled to the spacer.

12 Claims, 12 Drawing Sheets

INVERTER APPARATUS SUITABLE FOR BATTERY VEHICLE

BACKGROUND OF THE INVENTION

1. Field of the Invention

The present invention relates to an inverter apparatus used for generating a three-phase AC voltage from a DC voltage, and more particularly, to an inverter apparatus suitable for battery vehicles, such as battery forklifts.

2. Description of the Related Art

One of requirements imposed on the inverter apparatus is that the inverter apparatus is designed to support various specifications required by users. One approach for satisfying such a requirement is to adopt module-based design. Japanese Laid-Open Patent Application No. Jp-A-Heisei 10-93220 discloses an inverter apparatus adopting module-based design, more specifically, an inverter apparatus in which component parts are optimally distributed to an insulated metal substrate (IMS) and a printed circuit board. The inverter apparatus disclosed in this application incorporates power transistors on the insulated metal substrate, and control components and driving components on the printed circuit board.

In addition to the requirement described above, there are still other requirements imposed on the inverter apparatus adopting module-based design. Additional requirements imposed on the inverter apparatus are as follows:

(1) Improvement in Mechanical Strength, Including Vibration Resistance

The improvement in the mechanical strength, especially vibration resistance, is an important requirement imposed on the inverter apparatus mounted on battery vehicles. Components within the inverter apparatus mounted on the battery vehicle, such as cables, interconnections, circuit boards, electronic devices, and structural members, are subject to strong mechanical vibration. It is especially important that high current interconnections, such as bus bars, are designed to be resistant to mechanical vibration within the inverter apparatus.

(2) Optimization of Electrical Connections Between Insulated Metal Substrates and Printed Circuit Board The electrical connections between the insulated metal substrates and the printed circuit board have influences on noise resistance. In addition, when the printed circuit board is provided with power supply and ground patterns that maintain a DC power supply voltage, and electrolytic capacitors connected therebetween, the optimization of the electrical connections between the insulated metal substrates and the printed circuit board have influences on the ratio of the printed circuit board occupied by the power supply and ground patterns. Forming wide power supply and/or ground patterns on the printed circuit board is effective for improving the noise resistance and for stabilizing the DC power supply voltage.

(3) Three-phase Symmetry in Circuit Layout

In order to achieve improved uniformity among U-phase, V-phase and W-phase currents, it is preferable that internal circuits within the inverter apparatus be arranged in symmetry with respect to the U-, V-, and W-phases.

(4) Prevention of Current Concentration on Specific Power Transistors

Power transistors may be connected in parallel within an inverter output stage when the inverter apparatus is designed to generate large output currents. In this case, it is preferable that uniform currents flow through the power transistors connected in parallel. Current concentration on specific power transistors is not preferable, since this may lead to damage to the specific power transistors.

These requirements are all desired to be satisfied under limitations on the volume of the inverter apparatus. For example, it is not preferable that the area occupied by the inverter output stage is increased in order to achieve improved uniformity of the currents though the power transistors. As far as the inventors know, no solution has been provided for the architecture of an inverter apparatus that satisfies these requirements on a practical level.

SUMMARY OF THE INVENTION

Therefore, the present invention generally addresses providing improved inverter architecture that satisfies at least one of the requirements described above.

More specifically, it is an object of the present invention to provide an inverter apparatus superior in mechanical strength, especially, vibration resistance.

It is another object of the present invention to optimize electrical connections between insulated metal substrates (IMS) and a printed circuit board.

It is still another object of the invention to arrange internal circuits within the inverter apparatus in symmetry with respect to U-, V-, and W-phase.

It is still another object of the present invention to provide inverter architecture that permits currents to flow through power transistors with improved uniformity.

In an aspect of the present invention, an inverter apparatus is composed of an insulated metal substrate, a conductive stud, a printed circuit board, a conductive spacer, and a bus bar. An inverter output stage is mounted on the insulated metal substrate. The conductive stud is coupled to a main surface of the insulated metal substrate, and electrically connected with the inverter output stage. The printed circuit board is supported by the stud. The stud is coupled on the rear surface of the printed circuit board. Provided on the main surface of the printed circuit board is a circuit connected to the inverter output stage. The conductive spacer is coupled on the main surface of the printed circuit board, and electrically connected with the stud. The bus bar is coupled to the spacer.

Preferably, the bus bar is formed of annealed copper.

The inverter apparatus may further include a base plate on which the insulated metal substrate is provided, and an electrode terminal fixed to the base plate, the electrode terminal including an insulating spacer fixed to the base plate; a bolt fixed to the insulating spacer; a conductive terminal spacer through which the bolt is inserted; and a nut through which the bolt is inserted for securing a terminal of a cable between the nut and the terminal spacer.

When the bus bar is formed of annealed copper, it is preferable that the inverter apparatus additionally includes a rotation-preventive fitting preventing rotation of the terminal spacer around the bolt.

In this case, the rotation-preventive fitting is disposed between the nut and the terminal spacer, and engaged with a cover of the inverter apparatus.

When the stud is coupled with the insulated metal substrate through soldering, it is preferable that a coupling face between the stud and the insulated metal substrate is circular.

In this case, it is preferable that the stud includes a cylindrical body portion coupled to the insulated metal substrate, and the body portion has a diameter of 10 mm or less.

It is further preferable that the body portion has a height of 12 mm or less.

When the stud is coupled to the insulated metal substrate through soldering, the stud preferably has a cavity open into the coupling face between the stud and the insulated metal substrate.

Preferably, the stud and the spacer are mechanically coupled using threads with the printed circuit board sandwiched therebetween.

In another aspect of the present invention, an inverter apparatus is composed of a U-phase output stage configured to output a U-phase voltage; a V-phase output stage configured to output a V-phase voltage; a W-phase output stage configured to output a W-phase voltage; a printed circuit board on which a smoothing capacitor for stabilizing a DC power supply voltage fed to the U-phase, V-phase, and W-phase output stages; a U-phase drive circuit provided on the printed circuit board, and configured to switch power transistors within the U-phase output stage; a V-phase drive circuit provided on the printed circuit board, and configured to switch power transistors within the V-phase output stage; and a W-phase drive circuit provided on the printed circuit board, and configured to switch power transistors within the W-phase output stage. The U-phase drive circuit is positioned adjacent to a first edge of the printed circuit board. The V-phase drive circuit is positioned adjacent to a second edge of the printed circuit board. Finally, the W-phase drive circuit is positioned adjacent to a third edge of the printed circuit board.

The structure thus-described is especially suitable when the U-phase drive circuit is connected to the U-phase output stage through a first flat cable, the V-phase drive circuit is connected to the V-phase output stage through a second flat cable, and the W-phase drive circuit is connected to the W-phase output stage through a third flat cable.

In a preferred embodiment, the printed circuit board includes a power supply pattern and a ground pattern, and the smoothing capacitor is electrically connected between the power supply pattern and the ground pattern. The DC power supply voltage is maintained between the power supply pattern and the ground pattern.

When the U-phase, V-phase, and W-phase output stages are mounted on first, second, and third IMS boards, respectively, the first to third IMS boards are preferably arranged around a certain center point.

In still another aspect of the present invention, an inverter apparatus is composed of at least one U-phase IMS board associated with a U-phase and mounting a U-phase output stage configured to output a U-phase voltage; at least one V-phase IMS board associated with a U-phase, and mounting a V-phase output stage configured to output a V-phase voltage; and at least one W-phase IMS board a V-phase output stage associated with a W-phase, and mounting configured to output a V-phase voltage. The U-phase, V-phase, and W-phase IMS boards are arranged around a certain center point.

Preferably, the U-phase, V-phase, and W-phase IMS boards are arranged in first, second, and third regions, respectively, and one of the first, second, and third regions is positioned adjacent to remaining two of the first, second, and third regions.

In still another aspect of the present invention, an IMS board receiving a power supply level and a ground level to develop a voltage associated with one phase of a three-phase AC voltage is composed of an insulated metal substrate; a first stud provided on the insulated metal substrate to receive one of the power supply and ground levels; a second stud provided on the insulated metal substrate to output the voltage associated with the one phase; at least one third stud provided on the insulted metal substrate to receive another of the power supply and ground levels; a plurality of first power transistors connected in parallel between the first and second studs; and a plurality of second power transistors connected in parallel between the second stud and the at least one third stud. The first power-transistors are arranged in line in a first direction, and the second power transistors are arranged in line in the first direction. The first stud is positioned at a position away from a line of the plurality of first power transistors in the first direction, and the second stud is positioned at a position away from a line of the plurality of second power transistors in a second direction opposite to the first direction. Finally, the at least one third stud is positioned at a position away from the lines of the first and second power transistors in a third direction orthogonal to the first direction.

The IMS board may additionally include: a fourth stud provided on the insulated metal substrate to receive the one of the power supply and ground levels; a fifth stud provided on the insulated metal substrate to output the voltage associated with the one phase; a plurality of third power transistors connected in parallel between the fourth and fifth studs, and having the same conductivity type as the plurality of first power transistors; and a plurality of fourth power transistors connected in parallel between the at least one third stud and the fifth stud, and having the same conductivity type as the plurality of second power transistors. In this case, the first and fourth studs are preferably arranged mirror-symmetrically with respect to a certain symmetry plane, the second and fifth studs are preferably arranged mirror-symmetrically with respect to the symmetry plane. The first and third power transistors are preferably arranged mirror-symmetrically with respect to the symmetry plane, and the pluralities of second and fourth power transistors are preferably arranged mirror-symmetrically with respect to the symmetry plane. Finally, the at least one third stud is preferably arranged mirror-symmetrically with respect to the symmetry plane.

DESCRIPTION OF THE INVENTION

Preferred Embodiments are described below in detail with reference to the attached drawings.

Overall Structure

Figure 1A:
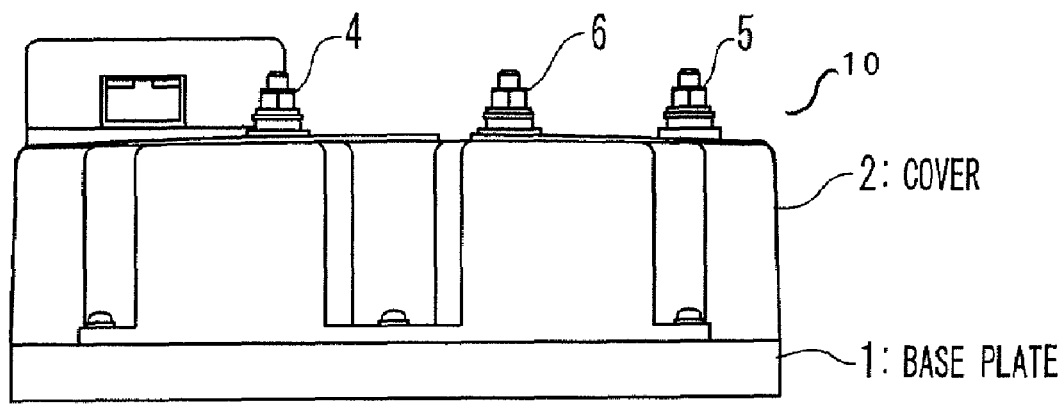
FIG. 1A is a front view of an inverter apparatus in one embodiment of the present invention.
Figure 1B:
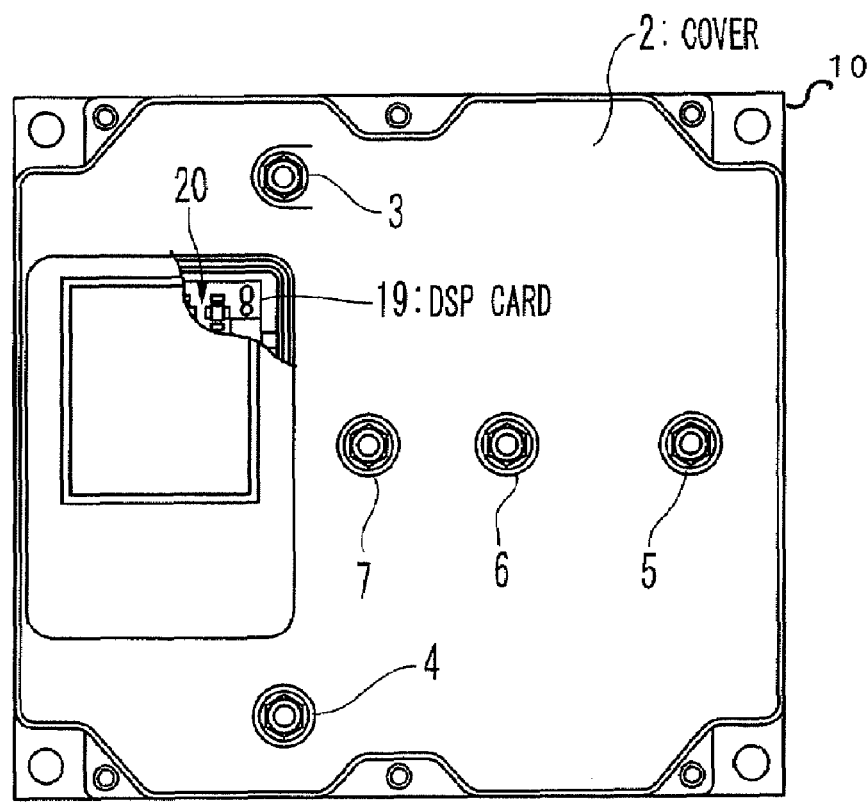
FIG. 1B is a top view of the inverter apparatus shown in FIG. 1A.

FIGS. 1A and 1B are front and top views, respectively, of an inverter apparatus 10 in one embodiment of the present invention. As will be described in detail below, the inverter apparatus 10 in this embodiment is configured to receive a DC power supply voltage from an external DC power source (for example, a battery) and to generate a three-phase AC voltage from the received DC power supply voltage.

Referring to FIG. 1A, the inverter apparatus 10 includes a metal base plate 1 and a resin cover 2 fixed to the base plate 1 with screws. As shown in FIG. 1B, the cover 2 is provided with holes through which five terminals are inserted: a positive electrode terminal 3, a negative electrode terminal 4, a U-phase terminal 5, a V-phase terminal 6, and a W-phase terminal 7. The positive electrode terminal 3 and the negative electrode terminal 4 are used for receiving a DC power supply voltage from an external DC power source (for example, a battery). The U-phase terminal 5, the V-phase terminal 6, and the W-phase terminal 7 are used for outputting a three-phase AC voltage.

Figure 2:
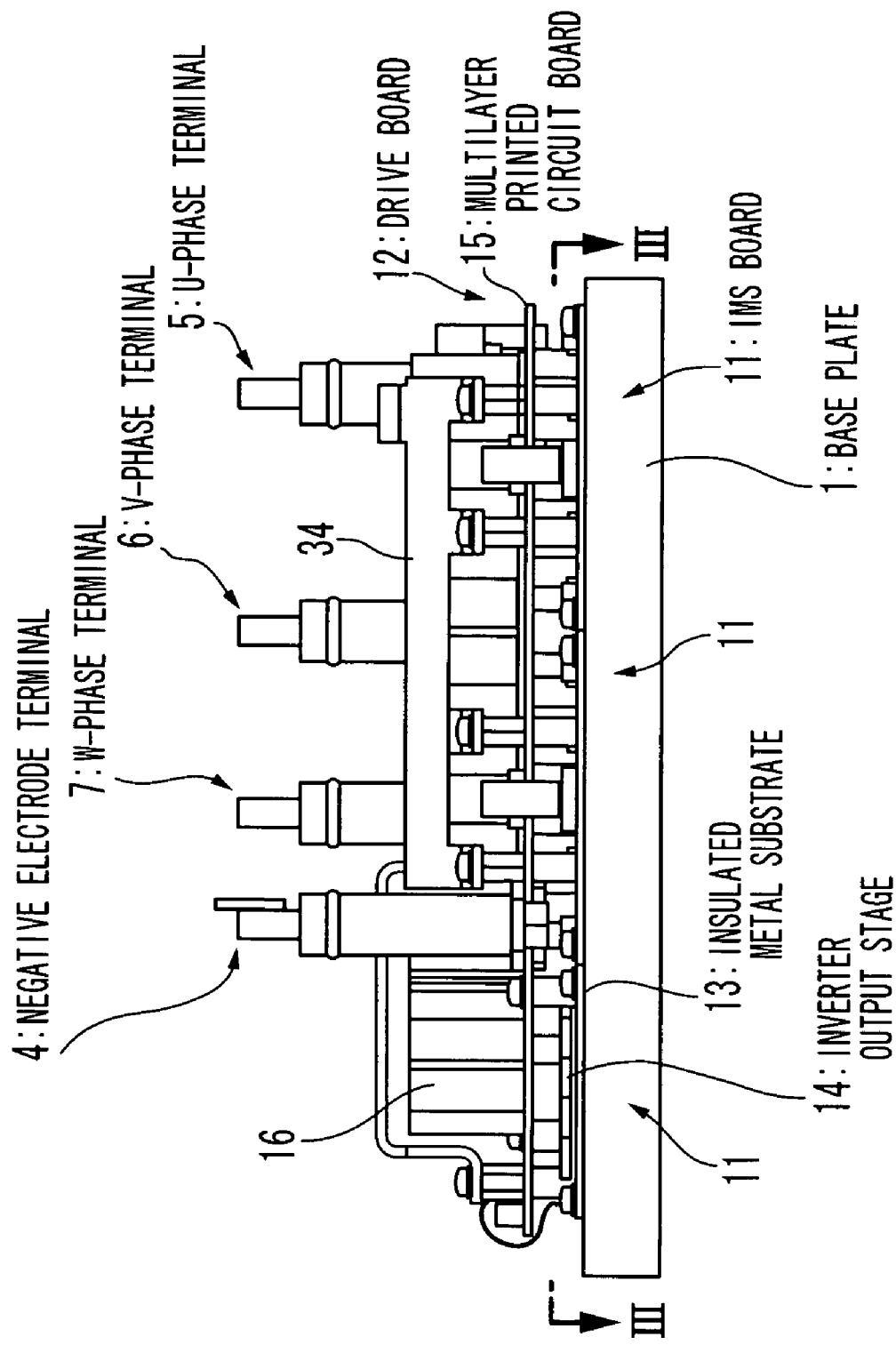
FIG. 2 is a front view of the inverter apparatus with the cover detached.

As shown in FIG. 2, IMS boards 11 and a drive board 12 are housed inside the cover 2. The Insulated Metal Substrate (IMS) boards 11 each include an insulated metal substrate (IMS) 13, on which an inverter output stage 14 is mounted. The inverter output stages 14 are each composed of power FETs (Field Effect Transistors) that output a three-phase AC voltage. The IMS boards 11 are fixed to the top surface of the metal base plate 1 with screws. The structure in which the IMS boards 11 incorporating power FETs generating a large amount of heat are mounted directly on the metal base plate 1 is effective for improving the heat radiation efficiency.

Figure 3:
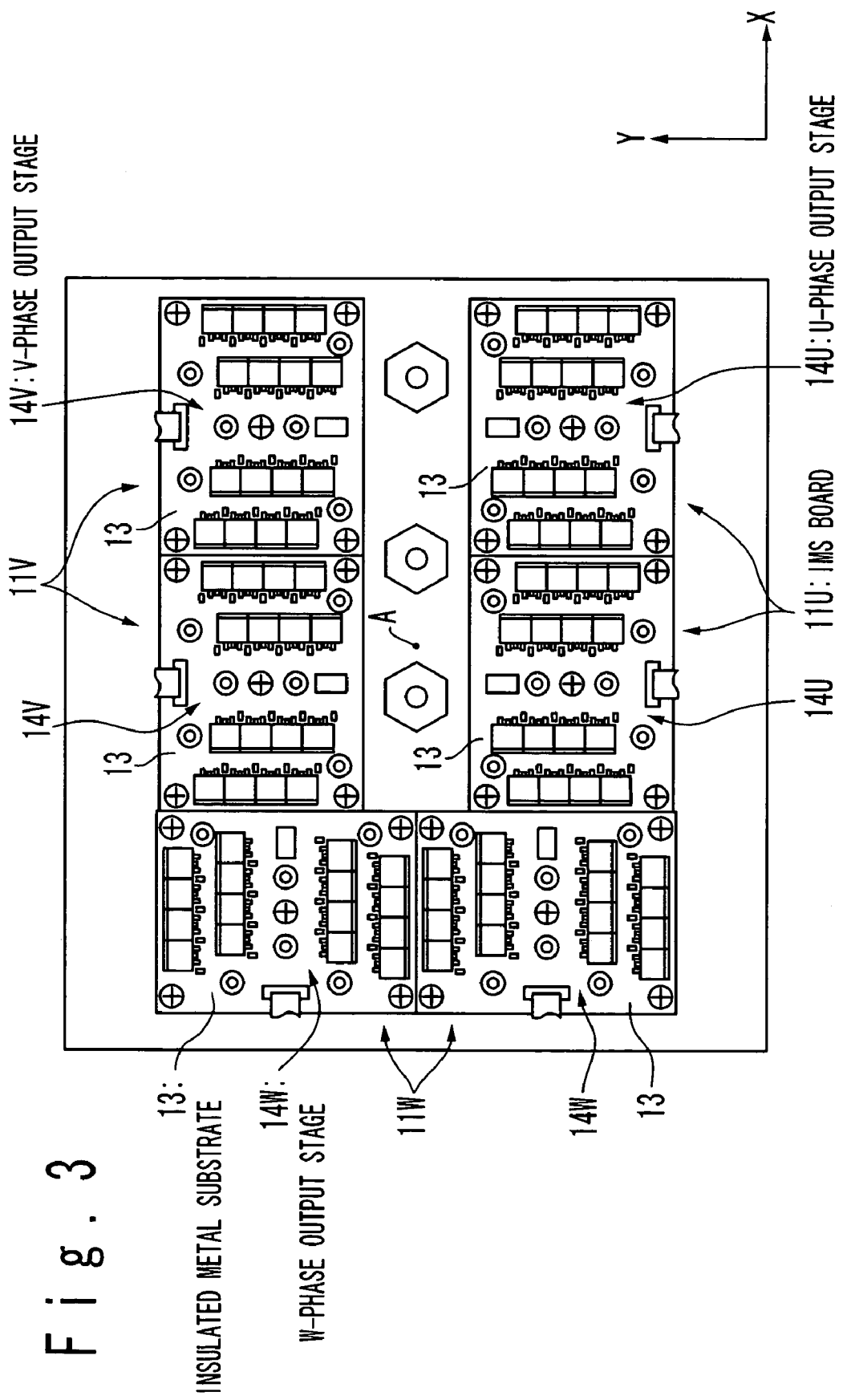
FIG. 3 is a top view of the inverter apparatus with the cover and drive board detached.
Figure 6:
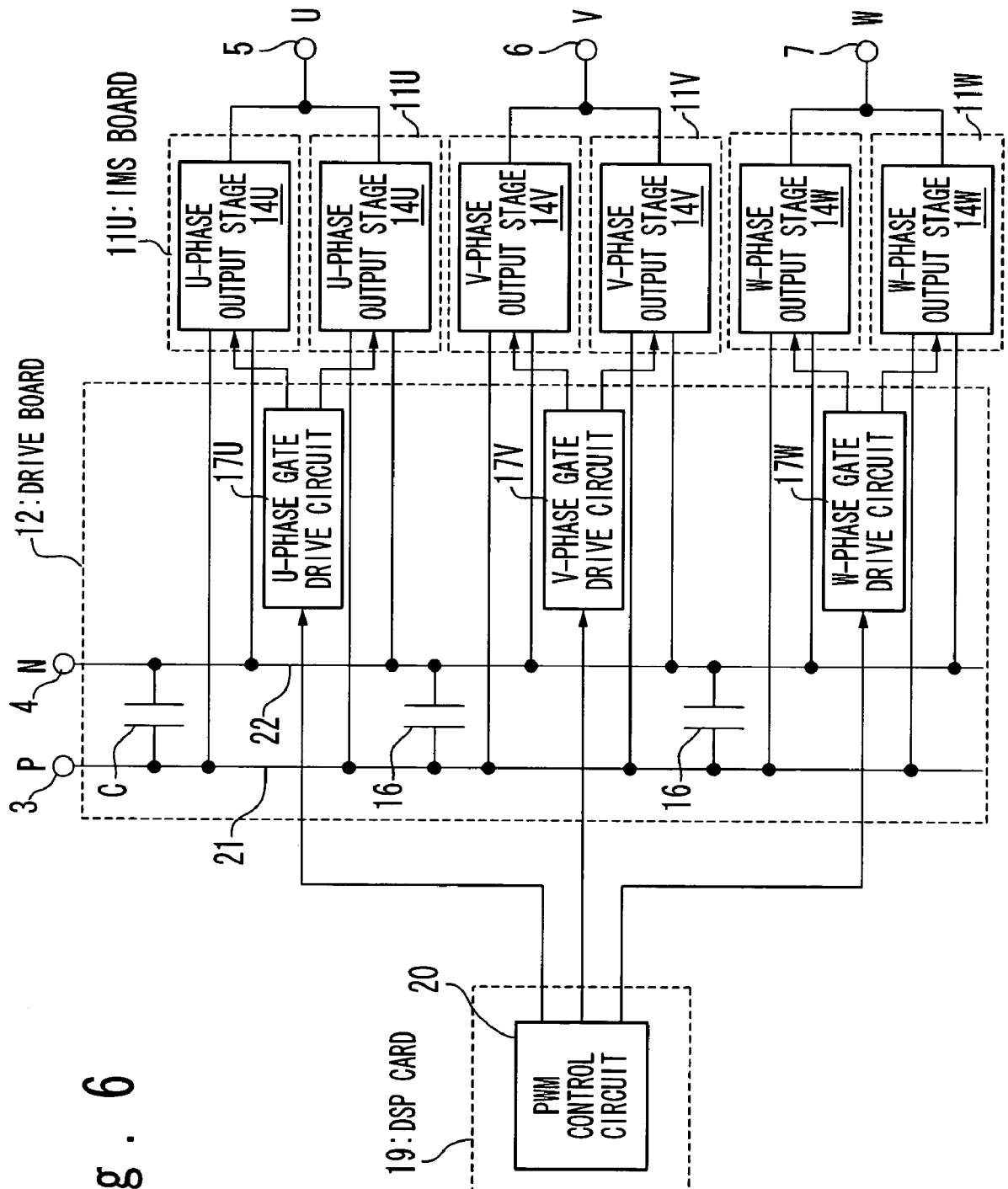
FIG. 6 is a circuit diagram of the inverter apparatus shown in FIG. 1A.

As shown in FIG. 3, two IMS boards 11 are prepared for each phase of a three-phase AC voltage. It should be noted that, in FIG. 3 and the description below, the IMS boards 11 associated with the U-phase, the V-phase, and the W-phase may be referred to as IMS boards 11U, 11V, and 11W, respectively. Similarly, the inverter output stages 14 associated with the U-phase, the V-phase, and the W-phase may be referred to as U-phase output stages 14U, V-phase output stages 14V, and W-phase output stages 14W, respectively. The output terminals of the inverter output stages 14 associated with the same phase are commonly connected together. More specifically, as shown in FIG. 6, the outputs of the U-phase output stages 14U mounted on the two IMS boards 11U are commonly connected together. The same applies to the V-phase output stages 14V and the W-phase output stages 14W.

As shown in FIG. 3, the IMS boards 11 have the same structure, regardless of the associated phases. Such structure is preferable for production of inverter apparatuses having various current capacities. In the present embodiment, two IMS boards 11 are prepared for each phase of the three-phase AC voltage. In an alternative embodiment, three IMS boards 11 may be prepared for each phase of a three-phase AC voltage. This permits providing an inverter apparatus with an increased current capacity. In still another embodiment, only one IMS board 11 may be prepared for each phase of the three-phase AC voltage. This permits providing an inverter apparatus with a reduced current capacity.

Figure 4:
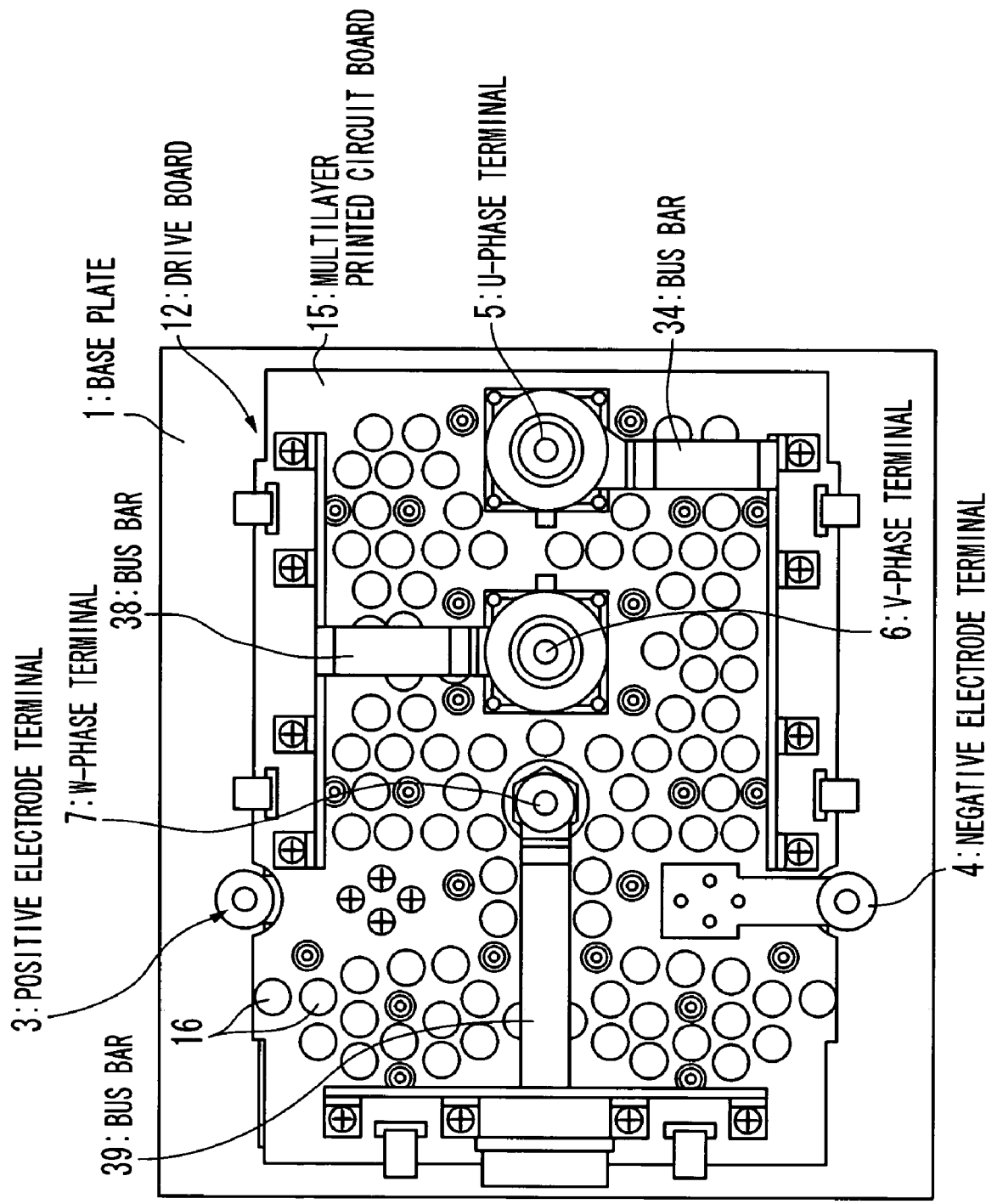
FIG. 4 is a top view of the inverter apparatus with the cover detached.

As shown in FIG. 4, the drive board 12 includes a multilayer printed circuit board 15 having four interconnection layers (not shown in FIG. 4).

Figure 5:
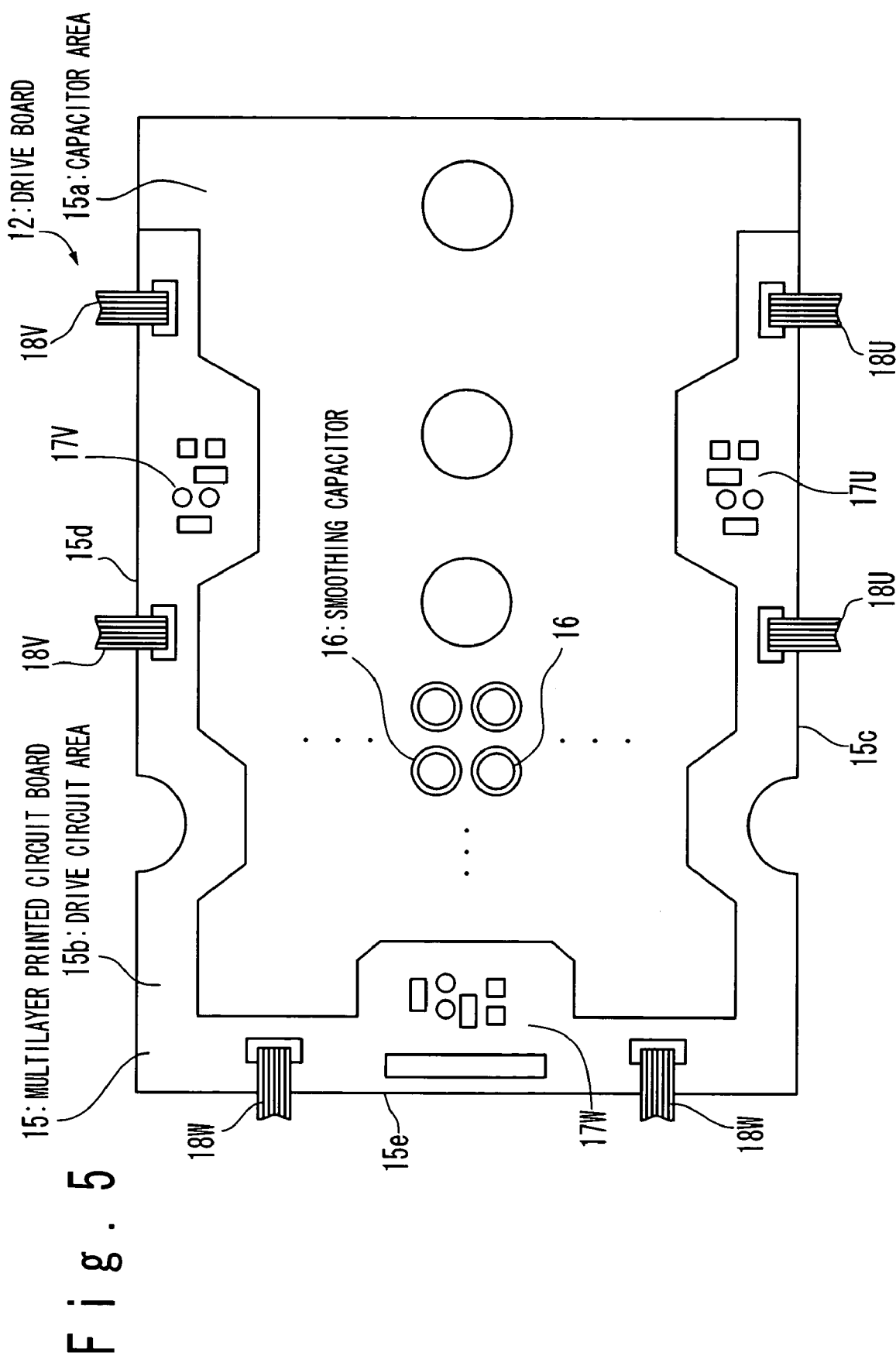
FIG. 5 is a schematic view showing the structure of the drive board.

The multilayer printed circuit board 15 includes a capacitor region 15a and a drive circuit region 15b as shown in FIG. 5. The capacitor region 15a is a region where smoothing capacitors 16 are mounted. It should be noted that only some of the smoothing capacitors 16 are shown in FIG. 4. In this embodiment, electrolytic capacitors are used as the smoothing capacitors 16. Within the capacitor region 15a, the upper two of the four interconnection layers within the multilayer printed circuit board 15 are used as a ground pattern, while the lower two thereof are used as a power supply pattern. As will be described later, the power supply pattern is electrically connected to the positive electrode terminal 3, and the ground pattern is connected to the negative electrode terminal 4. Each smoothing capacitors 16 has one terminal thereof connected to the ground pattern and the other terminal thereof connected to the power supply pattern. The smoothing capacitors 16 are used for stabilizing DC voltages received by the positive electrode terminal 3 and the negative electrode terminal 4. The power supply and ground patterns have a capacitance therebetween, and they themselves also function as a capacitor.

The drive circuit region 15b is prepared with a U-phase gate drive circuit 17U, a V-phase gate drive circuit 17V, and a W-phase gate drive circuit 17W, which are used for driving the gates of the power FETs of the U-phase output stages 14U, the V-phase output stages 14V, and the W-phase output stages 14W, respectively. The U-phase gate drive circuit 17U, the V-phase gate drive circuit 17V, and the W-phase gate drive circuit 17W are connected to the U-phase output stages 14U, the V-phase output stages 14V, and the W-phase output stages 14W, respectively, through flat cables 18U, 18V, and 18W, respectively.

Referring back to FIG. 1A, a DSP (digital signal processor) card 19 is additionally incorporated inside the cover 2. A PWM (Pulse Width Modulation) control circuit 20 is integrated on the DSP card 19 for implementing ON-OFF control of the power FETs within the inverter output stages 14.

FIG. 6 is a circuit diagram of the inverter apparatus 10. It should be noted that the circuit diagram of FIG. 6 does not necessarily reflect the spatial arrangement of the respective elements within the inverter apparatus 10. The power supply pattern (denoted by reference numeral 21 in FIG. 6) of the multilayer printed circuit board 15 receives the power supply level through the positive electrode terminal 3, and the ground pattern thereof (denoted by reference numeral 22 in FIG. 6) received the ground level through the negative electrode terminal 4, whereby a DC power supply voltage is developed between the power supply pattern 21 and the ground pattern 22. The DC power supply voltage between the power supply pattern 21 and the ground pattern 22 is maintained by the smoothing capacitors 16 and the electric capacity C provided therebetween. The DC power supply voltage is supplied to each of the U-phase output stages 14U, the V-phase output stages 14V, and the W-phase output stages 14W. The U-phase output stages 14U, the V-phase output stages 14V, and the W-phase output stages 14W generate the U-phase, V-phase, and the W-phase voltages, respectively, using the power FETs incorporated therein. The generated U-phase, V-phase, and W-phase voltages are outputted to the outside of the inverter apparatus 10 through the U-phase terminal 5, the V-phase terminal 6, and the W-phase terminal 7, respectively.

The ON-OFF control of the power FETs is implemented by the PWM control circuit 20, the U-phase gate drive circuit 17U, the V-phase gate drive circuit 17V, and the W-phase gate drive circuit 17W. The PWM control circuit 20 supplies gate control signals to the U-phase gate drive circuit 17U, the V-phase gate drive circuit 17V, and the W-phase gate drive circuit 17W, respectively, and thereby provides the ON-OFF control for the power FETs integrated within the U-phase output stages 14U, the V-phase output stages 14V, and the W-phase output stages 14W. In response to the gate control signals, the U-phase gate drive circuit 17U, the V-phase gate drive circuit 17V, and the W-phase gate drive circuit 17W switch on and off the associated power FETs within the inverter output stages 14.

Figure 7:
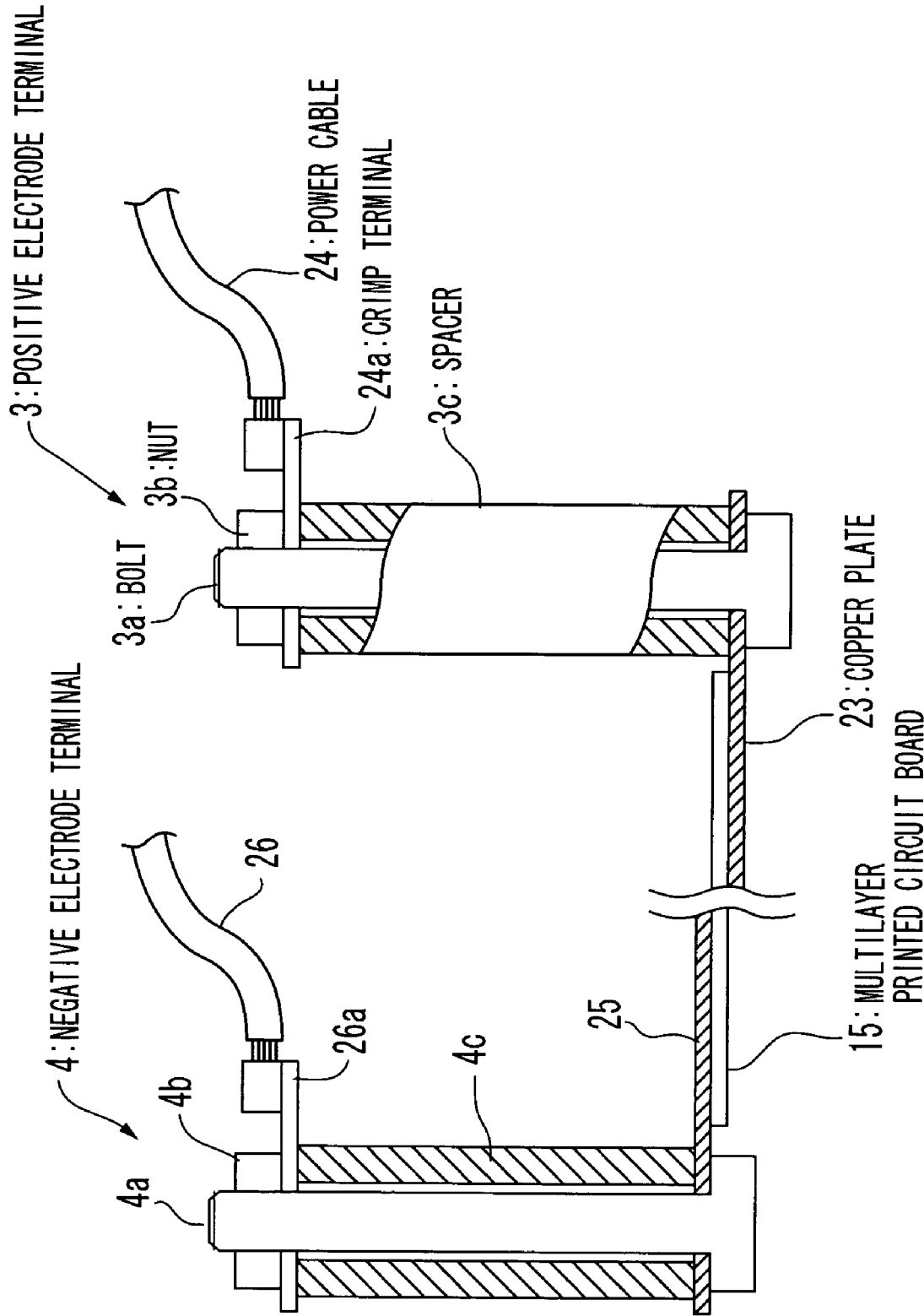
FIG. 7 is a partial sect-ion view showing the structure of positive and negative electrode terminals and the structure of the connecting portion between these terminals and the drive board.

FIG. 7 is a section view showing the structure of the positive electrode terminal 3 and the negative electrode terminal 4, also showing the structure of the connection portion between these terminals and the multiplayer printed circuit board 15. A copper plate 23 electrically connected to the power supply pattern 21 is joined with a screw (not shown) to the bottom surface of the multilayer printed circuit board 15. The positive electrode terminal 3 is joined to the copper plate 23.

More specifically, the positive electrode terminal 3 includes a bolt 3a of conductive material, a nut 3b, and a hollow cylindrical spacer 3c. The positive electrode terminal 3 is fixed to the copper plate 23 with the bolt 3a. Most simply, the bolt 3a may be joined to the copper plate 23 with the head brazed to the copper plate 23. Brazing the bolt head is preferable due to the easiness of assembling the positive electrode terminal 3. The bolt 3a is inserted through the spacer 3c and the upper end thereof is screwed with the nut 3b. The nut 3b is used for fixing the positive electrode terminal 3a with a power cable 24 connected to a positive electrode of the external DC power source. A crimping terminal 24a provided at the leading end of the power cable 24 is sandwiched between the upper nut 3b and the spacer 3c. The upper nut 3b is fastened to the bolt 3a, whereby the power cable 24 is fixed to the positive electrode terminal 3.

The same applies to the negative electrode terminal 4. A copper plate 25 electrically connected to the ground pattern 22 is joined with a screw to the top surface of the multilayer printed circuit board 15, and the negative electrode terminal 4 is joined to the copper plate 25. As is the case with the positive electrode terminal 3, the negative electrode terminal 4 includes a bolt 4a of conductive material, a nut 4b, and a hollow cylindrical spacer 4c into which the bolt 4a is inserted. The negative electrode terminal 4 is fixed to the copper plate 25 with the bolt 4a. The bolt 4a may be joined to the copper plate 25 through brazing.

A crimping terminal 26a is joined to the leading end of a power cable 26 connected to a negative electrode of the external DC power source, and the power cable 26 is fixed to the negative electrode terminal 4 with the crimping terminal 26a and the nut 4b.

Support Structure of Drive Board

Figure 8:
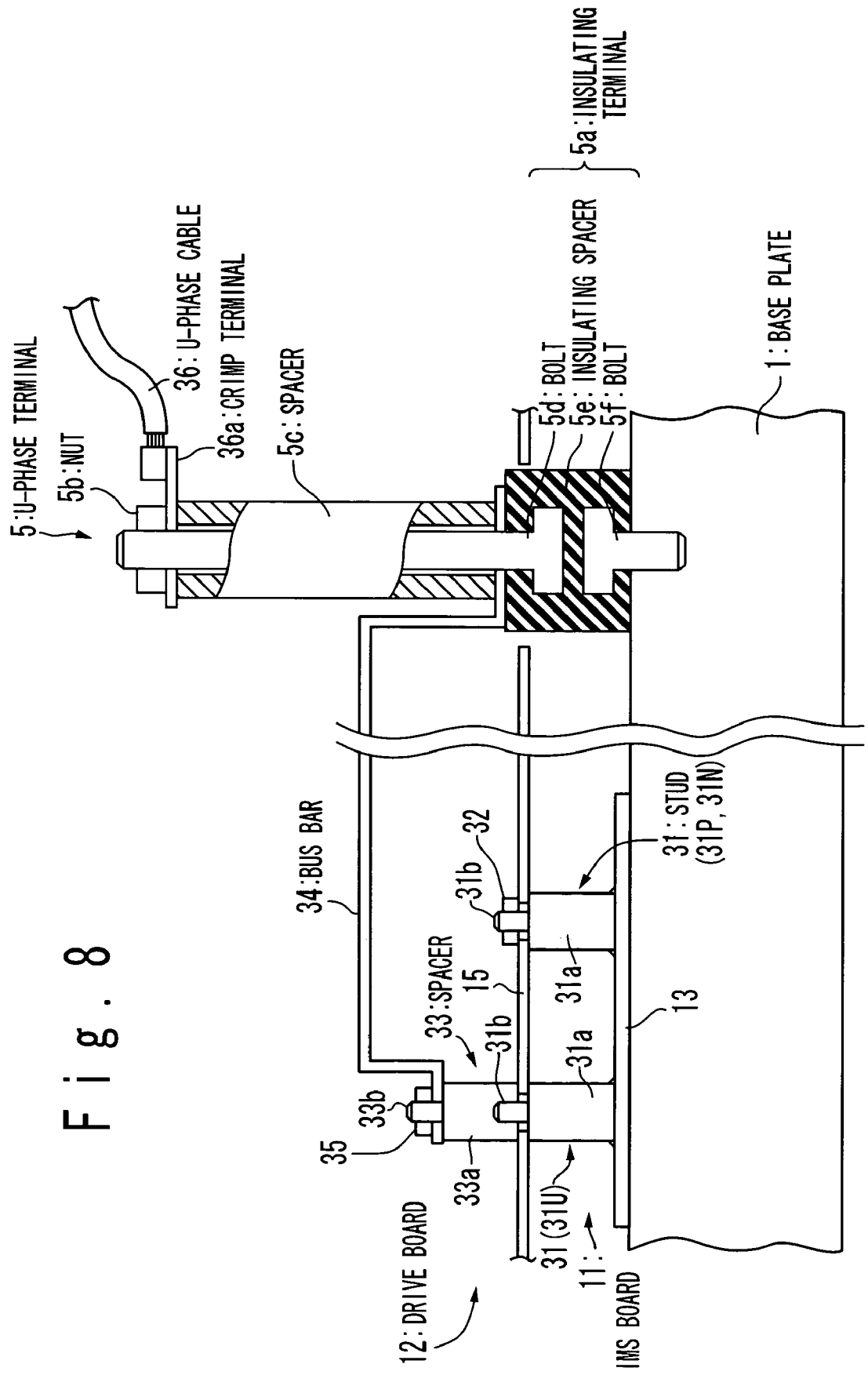
FIG. 8 is a partial section showing the support structure of the drive board and the structure of a U-phase terminal.

A first feature of the inverter apparatus 10 in this embodiment is concerned with the support structure of the drive board 12. As shown in FIG. 8, the drive board 12 is supported by studs 31 joined on the top surfaces of the insulated metal substrates 13 of the IMS boards 11. The studs 31 are made of conductive material and are joined on the top surfaces of the insulated metal substrates 13 by soldering with cream solder.

The studs 31 are each composed of a cylindrical body portion 31a and a screw portion 31b provided on the upper end of the body portion 31a. External threads are formed at the screw portions 31b of the studs 31. The screw portions 31b are inserted through openings formed through the multilayer printed circuit board 15.

The studs 31 are used not only for mechanically supporting the drive board 12 but also for providing electrical connections between the drive board 12 and the IMS boards 11. More specifically, the studs 31 are used for supplying the power supply level and the ground level from the power pattern 21 and the ground pattern 22, respectively, within the multilayer printed circuit board 15 to the inverter output stages 14 (not shown in FIG. 8) mounted on the IMS boards 11. In the description below, the studs 31 may be identified with subscripts in accordance with the electrical functions, if necessary. The studs 31 used for supplying the power supply level to the inverter output stages 14 may be referred to as positive electrode studs 31P, and the studs 31 used for supplying the ground level to the inverter output stages 14 may be referred to as negative electrode studs 31N.

The positive and negative electrode studs 31P and 31N are jointed to the multilayer printed circuit board 15 with the nut 32 being screwed from above the multilayer printed circuit board 15. The positive electrode studs 31P are electrically connected to the power supply pattern 21 formed on the bottom surface of the multilayer printed circuit board 15. Similarly, the negative electrode studs 31N are connected with the nut 32 to the ground pattern 22 formed on the top surface of the multilayer printed circuit board 15.

The studs 31 are also used for providing electrical connections through the drive board 12 between the output terminals of the inverter output stages 14 mounted on the IMS boards 11 and the U-phase terminal 5, the V-phase terminal 6, and the W-phase terminal 7, respectively. The studs 31 used for providing electrical connections between the output terminals of the U-phase output stages 14U and the U-phase terminal 5 may be referred to as U-phase studs 31U. Similarly, the studs 31 associated with the V-phase and the W-phase may be referred to as V-phase studs 31V and W-phase studs 31W, respectively.

The structure for providing electrical connections between the output terminals of the inverter output stages 14 and the U-phase, V-phase, and W-phase terminals 5, 6, and 7 is one of the important features of the inverter apparatus in this embodiment. Hereinafter, a detailed description will be made of the structure for providing electrical connections between the output terminals of the U-phase output stages 14U and the U-phase terminal 5.

The electrical connections between the output terminals of the U-phase output stages 14U and the U-phase terminal 5 are achieved through the U-phase studs 31U, spacers 33 and a bus bar 34. The spacers 33 each have an internal screw in the bottom portion thereof. The U-phase studs 31U are joined to the multilayer printed circuit board 15 with the spacers 33 screwed from above the multilayer printed circuit board 15. The spacers 33 are each composed of: a body portion 33a formed with an internal screw, and a screw portion 33b formed with an external screw. The screw portions 33b of the spacers 33 are inserted through openings provided through the bus bar 34. The bus bar 34 is electrically and mechanically connected to the spacers 33 with nuts 35 screwed from above the bus bar 34. The bus bar 34 is formed of copper.

The bus bar 34 is also electrically and mechanically connected to the U-phase terminal 5. The U-phase terminal 5 is composed of an insulating terminal 5a, a nut 5b, and a hollow and cylindrical spacer 5c. The insulating terminal 5a is composed of bolts 5d and 5f of conductive material and an insulating spacer 5e. The heads of the bolts 5d and 5f are embedded in the insulation spacer Se, separated by the insulating spacer 5e. The bolt 5f is screwed into an internal thread formed on the base plate 1, whereby the insulating terminal 5a, i.e., U-phase terminal 5, is fixed to the base plate 1. On the other hand, the bolt 5d is used for fixing a U-phase cable 36 to the U-phase terminal 5. The U-phase cable 36 is used for outputting the U-phase voltage to the outside of the inverter apparatus 10. The bolt 5d is inserted through the spacer 5c with the top end thereof screwed with the nut 5b. A crimping terminal 36a is provided at the leading end of the U-phase cable 36, and sandwiched between the nut 5b and the spacer 5c. The nut 5b is fastened to the bolt 5d, whereby the U-phase cable 36 is fixed to the U-phase terminal 5.

One advantage of the structure shown in FIG. 8 is improved vibration resistance with reduced volume. With the structure shown in FIG. 8, the function of mechanically supporting the drive board 12 and the function of electrically connecting between the IMS boards 11 and the drive board 12 are achieved with the same members, i.e., the studs 31. This contributes to the reduction in the volume of the inverter apparatus 10. On the other hand, mechanical load exerted on the bus bar 34 by vibration does not directly act on the U-phase studs 31U; the mechanical load exerted on the bus bar 34 is firstly received by the multilayer printed circuit board 15 of the drive board 12 so that the mechanical load is distributed to other studs 31. This effectively prevents excessive mechanical load from being selectively added to specific ones of the studs 31, thereby effectively improving the vibration resistance.

It should be noted that the bus bar 34 is not directly connected to the drive board 12 as shown in FIG. 8. Conventionally, the connection of a bus bar to a printed circuit board is usually achieved through soldering the bus bar onto the printed circuit board. Such structure, however, undesirably suffers from a problem that the bus bar is easily detached from the printed circuit board when vibration is applied to the bus bar. On the contrary, the structure shown in FIG. 8, the bus bar 34 is not directly connected to the drive board 12, but is joined to the spacer 33 coupled to the multilayer printed circuit board 15 with the nut 35. Such structure is effective for reliably fixing the bus bar 34.

To further improve the vibration resistance, it is preferable that the bus bar 34 be formed of annealed copper. Since the annealed copper is soft, forming the bus bar 34 with annealed copper effectively prevents the vibration applied to the bus bar 34 from being transmitted to the drive board 12 (and the studs 31). This effectively improves the vibration resistance of the inverter apparatus 10.

Although effectively improving the vibration resistance, forming the bus bar 34 with annealed copper also causes an undesirable effect that the bus bar 34 exhibits easy plastic deformation. The easy plastic deformation of the bus bar 34 may cause a problem when the crimping terminal 36a is tightened to the spacer 5c with the nut 5b. When the crimping terminal 36a is tightened to the spacer 5c with the nut 5b, the frictional force acting between the nut 5b and the crimping terminal 36a may cause the crimping terminal 36a to rotate about the bolt 5d. The rotation of the crimping terminal 36a may cause the spacer 5c to rotate about the bolt 5d. Due to the frictional force acting between the spacer 5c and the bus bar 34, the rotation of the spacer 5c may cause the deformation of the bus bar 34.

Figure 9:
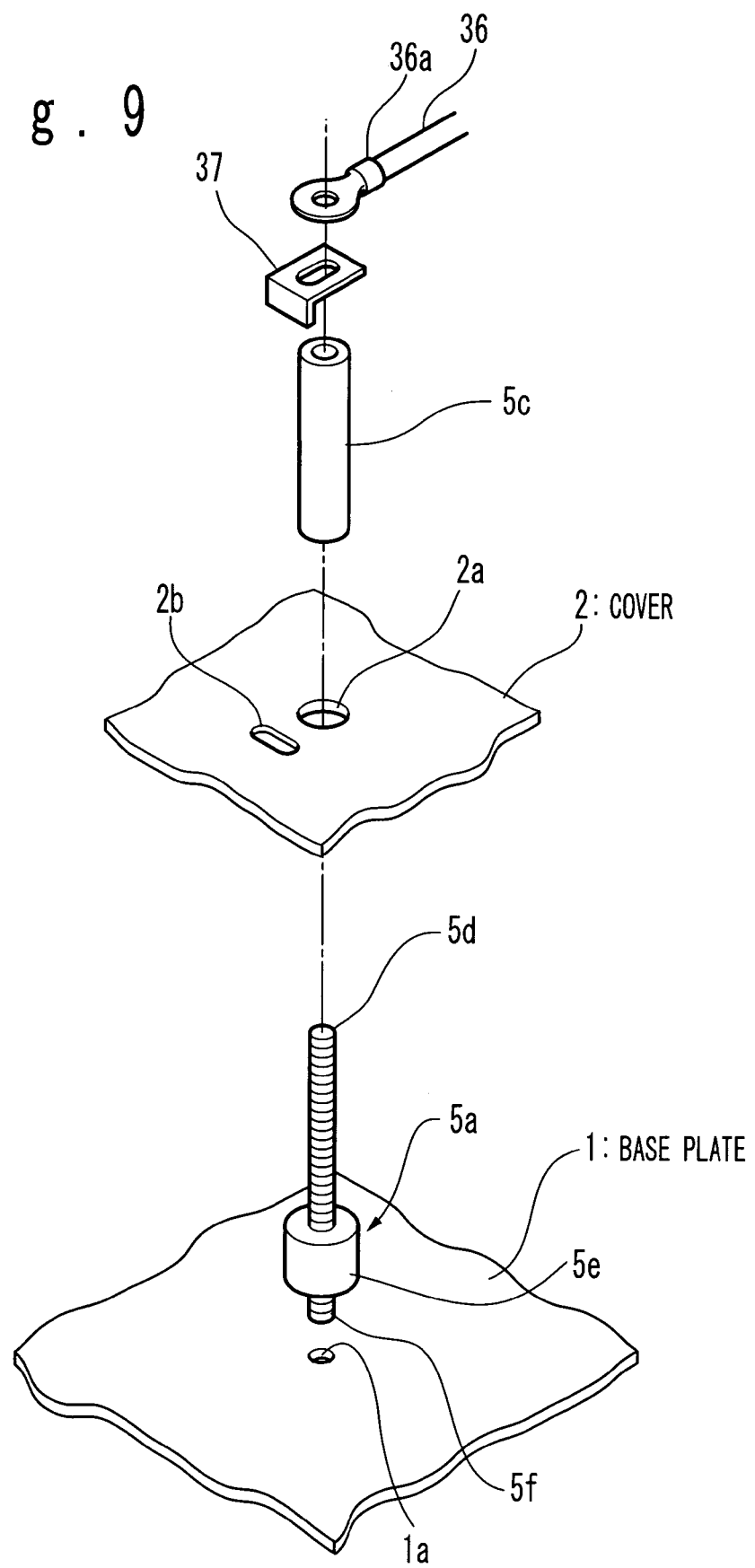
FIG. 9 is a perspective view showing a preferred structure of the U-phase terminal.

To prevent the bus bar 34 from being deformed when the crimping terminal 36a is tightened to the spacer 5c with the nut 5b, it is preferable that the rotation of the crimping terminal 36a be prevented. In order to prevent the rotation of the crimping terminal 36a, as shown in FIG. 9, it is preferable that a rotation-preventive metal fitting 37 be inserted between the crimping terminal 36a and the spacer 5c. In one embodiment, the rotation-preventive metal fitting 37 is formed of a bent metal plate, and provided with an opening through which the bolt 5d is inserted, in the portion to be sandwiched between the crimping terminal 36a and the spacer 5c. The cover 2 is provided with a groove 2b through which the rotation-preventive metal fitting 37 is inserted, near the opening 2a through which the spacer 5c and the bolt 5d of the U-phase terminal 5 are inserted. The rotation-preventive metal fitting 37 is engaged with the cover 2 with the groove 2b. Such structure avoids the rotation of the spacer 5c caused by the rotation of the nut 5b and thereby effectively prevents the deformation of the bus bar 34. Even when the nut 5b is rotated, the rotation-preventive metal fitting 37 is engaged with the groove 2b, so that the crimping terminal 36a does not rotate, either. Therefore, the spacer 5c does not rotate either, and thus the bus bar 34 does not become deformed.

In an alternative embodiment, the rotation-preventive metal fitting 37 may be provided between the nut 5b and the crimping terminal 36a, instead of between the crimping terminal 36a and the spacer 5c. Such structure also avoids the deformation of the bus bar 34 caused by the rotation of the spacer 5c.

The structure described above is also applied to the structure for connecting the output terminals of the V-phase output stages 14V to the V-phase terminal 6 and to the structure for connecting the output terminals of the W-phase output stages 14W to the W-phase terminal 7. As shown in FIG. 4, the output terminals of the V-phase output stages 14V are mechanically and electrically connected through the studs 31 and the spacers 33 (not shown in FIG. 4) to a bus bar 38 connected to the V-phase terminal 6. The structure for connecting the output terminals of the V-phase output stages 14V to the V-phase terminal 6 is identical to the structure for connecting the output terminals of the U-phase output stages 14U to the U-phase terminal 5 except for a difference in the structure of the bus bar 38. Similarly, the output terminals of the W-phase output stages 14W are mechanically and electrically connected through the studs 31 and the spacers 33 (not shown in FIG. 4) to a bus bar 39 connected to the W-phase terminal 7. The structure for connecting the output terminals of the W-phase output stages 14W to the W-phase terminal 7 is identical to the structure for connecting the output terminals of the U-phase output stages 14U to the U-phase terminal 5 except for a difference in the structure of the bus bar 39.

It is obvious to those skilled in the art that the structures shown in FIGS. 8 and 9 are also applicable to the positive electrode terminal 3 and the negative electrode terminal 4.

To further improve the vibration resistance, it is important to improve the coupling strength between the insulated metal substrates 13 and the studs 31. Insufficient coupling strength between the insulated metal substrates 13 and the studs 31 may cause the studs 31 to be detached from the insulated metal substrates 13 when vibration is applied to the bus bar 34.

Figure 10:
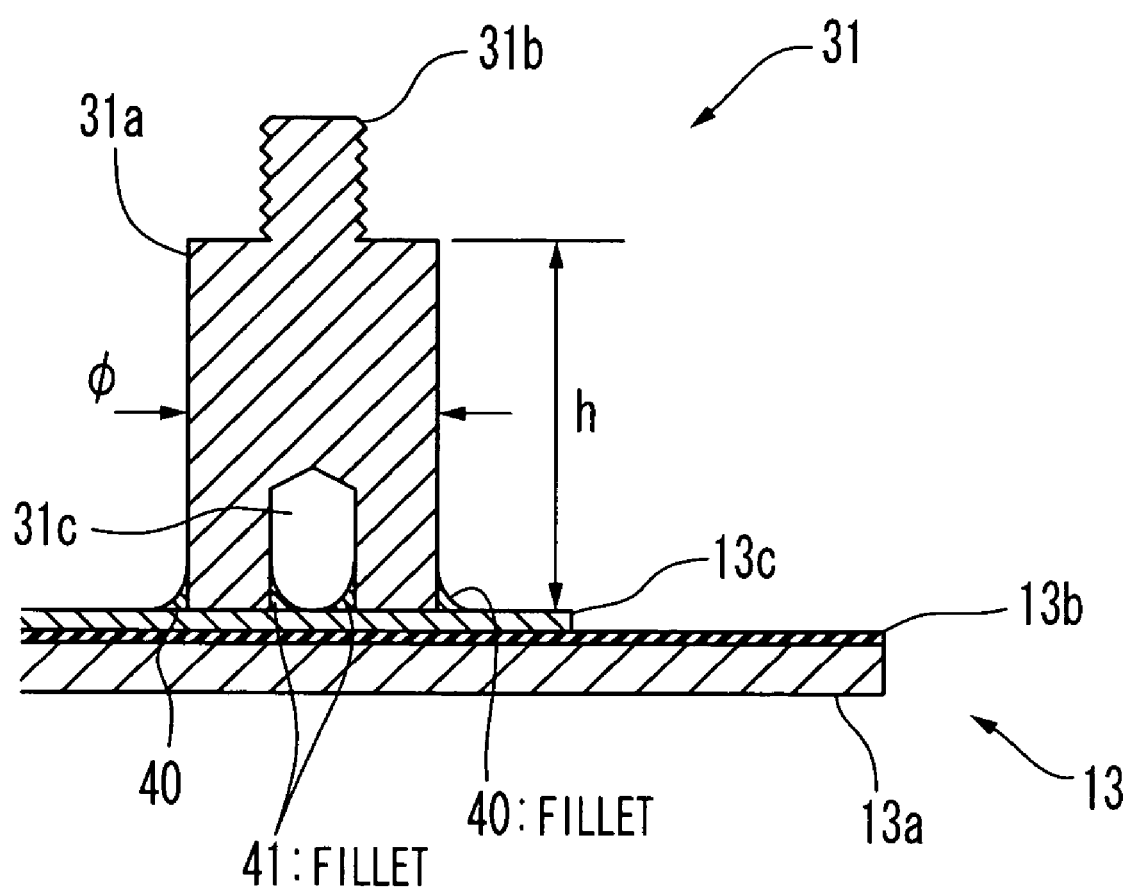
FIG. 10 is a section view showing a preferred structure of a stud provided on an IMS board.

One approach for improving the coupling strength between the insulated metal substrates 13 and the studs 31 is to optimize the structure of the coupling portions between the insulated metal substrates 13 and the studs 31. FIG. 10 is a cross section showing a preferred structure of the joint portions between the insulated metal substrates 13 and the studs 31. The insulated metal substrates 13 (one shown) are each composed of a metal plate 13a covered with an insulating layer 13b, and copper foils (one shown) 13c formed on the insulating layer 13b. The studs 31 are soldered onto the copper foils 13c. More specifically, soldering between the studs 31 and the copper foils 13c is performed in the following manner: First, cream solder is applied onto the copper foils 13c. This is followed by reflowing; the insulated metal substrates 13 and the studs 31 are heated in a reflow furnace, whereby the studs 31 are soldered to the copper foils 13c. Through such soldering, fillets 40 are formed on the outer edges of the joint surfaces between the insulated metal substrates 13 and the studs 31 as shown in FIG. 10. The fillets 40 are important for improving the coupling strength between the insulated metal substrates 13 and the studs 31.

To improve the coupling strength between the insulated metal substrates 13 and the studs 31, the following three techniques are employed in this embodiment. A first technique is forming the body portions 31a of the studs 31 into a cylindrical shape, whereby the outer edges of the joint surfaces between the insulated metal substrates 13 and the studs 31 are circular shaped. Such structure effectively avoids local stress concentration on the joint surfaces between the insulated metal substrates 13 and the studs 31, thus effectively improving the coupling strength between the insulated metal substrates 13 and the studs 31.

The second technique is optimizing the dimensions of the studs 31. More specifically, it is preferable that the body portions 31a of the studs 31 have a diameter $\phi$ of 10 mm or less, because the width and height of the fillets 40 formed at the coupling portions between the insulated metal substrates 13 and the studs 31 are dependent on the viscosity of the molten solder. The coupling strength between the insulated metal substrates 13 and the studs 31 may be possibly increased by increasing the ratio of the width and height of the fillets 40 with respect to the diameter $\phi$ of the body portions 31a of the studs 31. However, the width and height of the fillets 40 cannot be increased, facing limit due to the viscosity of the molten solder. Accordingly, in this embodiment, the diameter $\phi$ of the studs 31 is selected as 10 mm or less, whereby the ratio of the width and height of the fillets 40 with respect to the diameter $\phi$ of the studs 31 is optimized. This effectively provides a sufficiently high coupling strength. To further ensure the coupling between the insulated metal substrates 13 and the studs 31, it is preferable that the body portions 31a of the studs 31 have a height h of 12 mm or less. An excessive increase in the height h with respect to the width and height of the fillets 40 causes an excessively large torque to act on the coupling portions between the insulated metal substrates 13 and the studs 31, so that the studs 31 are easily detached from the insulated metal substrates 13. To prevent the studs 31 from being detached from the insulated metal substrates 13, it is preferable that the body portions 31a of the studs 31 have a height h of 12 mm or less.

The third technique is providing a cavity 31c in the bottom portion of each stud 31. The cavities 31c of the studs 31 are open into the coupling faces between the studs 31 and the insulated metal substrates 13. The cavities 31c brings two advantages as described below: A first advantage is that bubbles can be removed from the coupling faces between the insulated metal substrates 13 and the studs 31. As already described above, the process of heating the insulated metal substrate 13 (that is, the reflow process) is performed in soldering between the insulated metal substrates 13 and the studs 31. During the reflow process, the gas inside the cavity 31c is also heated and thereby expanded, and then the expanded gas is pushed outside from the cavity 31c through the liquefied cream solder. Then, the gas inside the cavity 31c contracts when the insulated metal substrate 13 is cooled down. This results in that the pressure inside the cavity 31c becomes negative, and a force is generated to push the studs 31 against the insulated metal substrates 13, whereby bubbles are removed from the coupling faces between the insulated metal substrates 13 and the studs 31. The removal of the bubbles from the coupling faces between the insulated metal substrates 13 and the studs 31 is effective for improving the coupling strength between the insulated metal substrates 13 and the studs 31. A second advantage is that fillets 41 are also formed at the edges of the cavities 31c of the studs 31. The formation of the fillets 41 in addition to the fillets 40 effectively improves the coupling strength between the insulated metal substrates 13 and the studs 31.

Layout of Multilayer Printed Circuit Board

With reference to FIG. 5, a second feature of the inverter apparatus 10 in this embodiment is that the drive circuit region 15b of the multilayer printed circuit board 15 (that is, the region where the U-phase, V-phase, and W-phase gate drive circuits 17U, 17V, and 17W are formed) is provided at the outer peripheral portion of the drive board 12. More specifically, the U-phase gate drive circuit 17U is provided along a first edge 15c of the multilayer printed circuit board 15, and the V-phase gate drive circuit 17V is provided along a second edge 15d of the multilayer printed circuit board 15 opposed to the first edge 15c. The W-phase gate drive circuit 17W is provided along a third edge 15e located between the first and second edges 15c and 15d. The capacitor region 15a is formed on the central portion of the drive board 12.

Such structure effectively increases in the areas of the power supply pattern 21 and the ground pattern 22 formed within the capacitor region 15a. The arrangement shown in FIG. 5 eliminate a need for providing openings for providing interconnections through the drive board 12 for achieving electrical connections of the U-phase, V-phase, and W-phase gate drive circuits 17U, 17V, and 17W with the U-phase, V-phase, and W-phase output stages 14U 14V, and 14W, respectively.

The increase in the areas of the power supply pattern 21 and the ground pattern 22 within the capacitor region 15a is effective for improving the noise resistance and also for stabilizing the DC power supply voltage maintained between the power supply pattern 21 and the ground pattern 22.

Arrangement of IMS Boards

Referring to FIG. 3, a third feature of the inverter apparatus 10 in this embodiment is the arrangement of the IMS boards 11. The six IMS boards 11 are arranged as to surround a given center point A defined at the center of the base plate 1, instead of being arranged in line. More specifically, a region where IMS boards 11 associated to a certain phase are arranged is so defined as to be adjacent to both regions where the IMS boards 11 associated with the other two phases are respectively arranged. Defining an X-Y coordinate system on the base plate 1 as shown in FIG. 3 for the description of the arrangement of the IMS boards 11, the region where the IMS boards 11U associated with the U-phase are arranged is located adjacent, in the positive Y-direction, to the region where the IMS boards 11V associated with the V-phase are arranged, and also located adjacent, in the negative X-direction, to the region where the IMS boards 11W associated with the W-phase are arranged.

Similarly, the region where the IMS boards 11V associated with the V-phase are arranged is located adjacent, in the negative X-direction, to the region where the IMS boards 11W associated with the W-phase are arranged, and also located adjacent, in the negative Y-direction, to the region where the IMS boards 11U associated with the U-phase are arranged. Finally, the region where the IMS boards 11W associated with the W-phase are arranged is located adjacent, in the positive X-direction, to both of the region where the IMS boards 11U associated with the U-phase are arranged and the region where the IMS boards 11V associated with the V-phase are arranged.

Such arrangement uniforms the average distances from the smoothing capacitors 16, the power supply pattern 21, and the ground pattern 22 to the U-phase output stages 14U provided on the IMS boards 11U, the V-phase output stages 14V provided on the IMS boards 11V, and the W-phase output stages 14W provided on the IMS boards 11W. This is quite effective for achieving improved uniformity in the magnitudes of currents supplied to the U-phase output stages 14U, the V-phase output stages 14V, and the W-phase output stages 14W.

It is preferable that the use of the arrangement of the IMS boards 11 surrounding the center point A leads to a synergetic effect together with the layout of the drive board 12 as shown in FIG. 5 (that is, the layout of the drive board 12 where the drive circuit region 15b is arranged at the outer peripheral portion). Arranging the IMS boards 11 so as to surround the center point A effectively reduces the lengths of the flat cables 18U, 18V, and 18W which connect the U-phase, V-phase, and W-phase gate drive circuits 17U, 17V, and 17W arranged on the drive circuit region 15b with the U-phase, V-phase, and W-phase output stages 14U, 14V, and 14W, respectively. This is preferable for suppressing fluttering of the flat cables 18U, 18V, and 18W and also for improving the noise resistance.

Circuit Layout of IMS Boards

Figure 11:
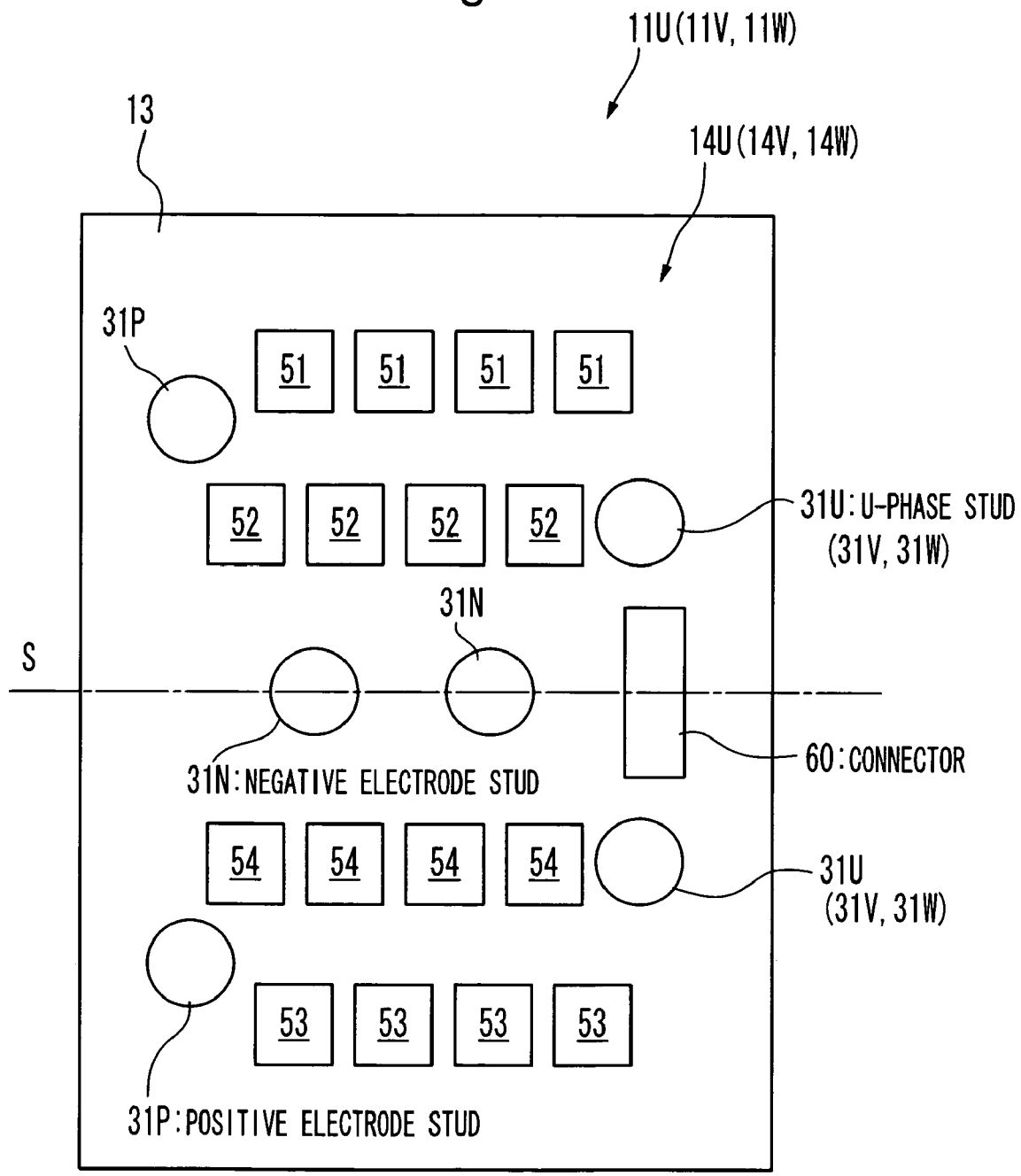
FIG. 11 is a top view showing a preferred layout of the IMS board.

The optimization of the circuit layout of the IMS boards 11 is important to prevent currents from concentrating on specific ones of the power FETs mounted on the inverter output stages 14. FIG. 11 is a plan view showing a preferred circuit layout of the IMS boards 11. It should be noted that, although FIG. 11 illustrates the circuit layout of the IMS boards 11U associated with the U-phase, the circuit layout of the IMS boards 11U is also applicable to circuit layouts of the IMS boards 11V and 11W associated with the V-phase and the W-phase, respectively.

Mounted on each IMS board 11U are: two positive electrode studs 31P, two negative electrode studs 31N, two U-phase studs 31U, the U-phase output stage 14U, and a connector 60. The U-phase output stage 14U includes high-side power MOSFETs 51 and 53 and low-side power MOSFETs 52 and 54. In this embodiment, N-channel power MOSFETs are used as both of the high-side power MOSFETs 51 and 53 and the low-side power MOSFETs 52 and 54. The connector 60 is used for providing electrical connections between the IMS board 11U and the U-phase gate drive circuit 17U disposed on the drive board 12. More specifically, the connector 60 is connected to the flat cable 18U connected to the U-phase gate drive circuit 17U.

Figure 12:
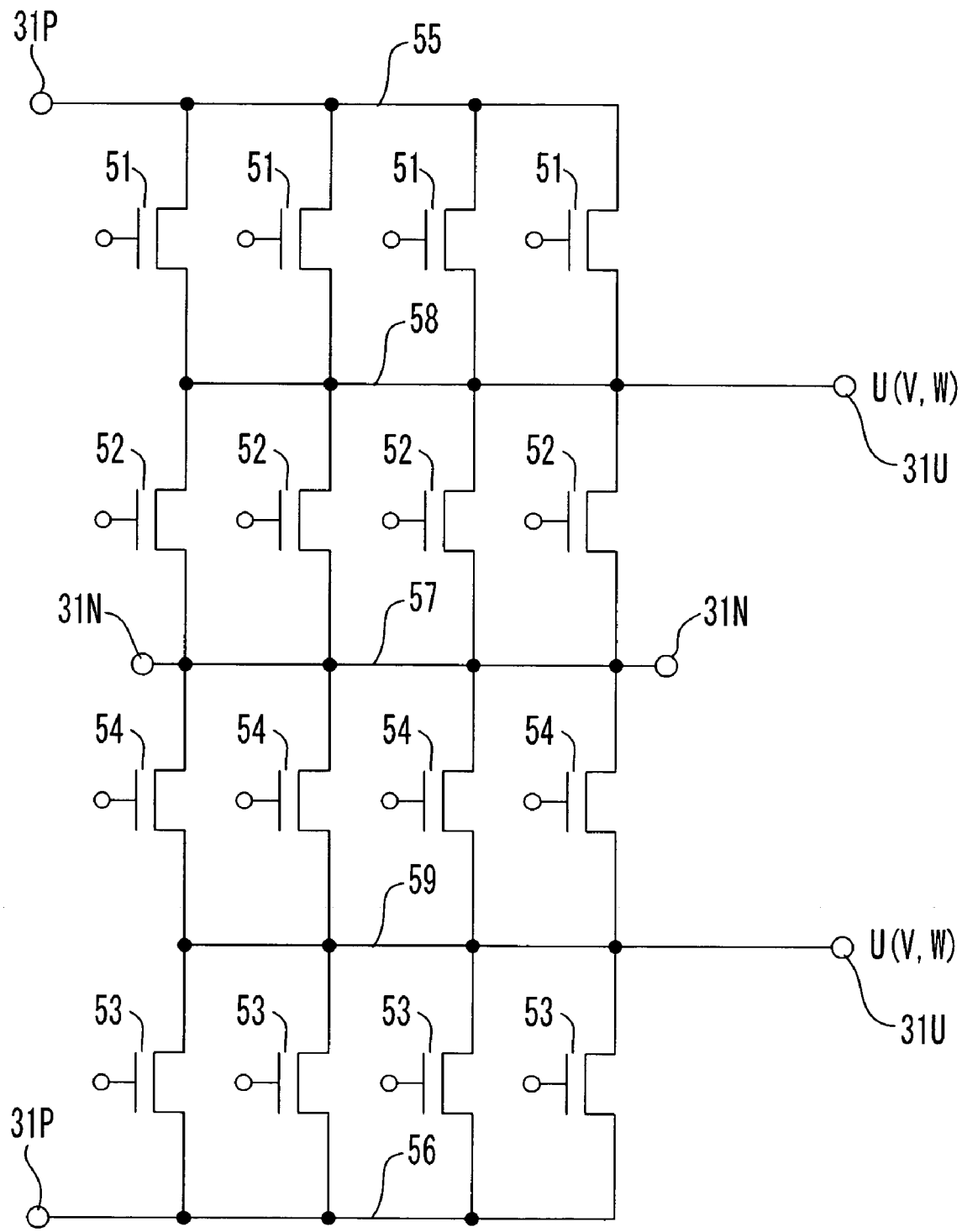
FIG. 12 is a circuit diagram of the IMS board.

FIG. 12 is a circuit diagram of the U-phase output stage 14U. One of the positive electrode studs 31P is connected to a positive node 55, while the other positive electrode stud 31P is connected to another positive node 56. The negative electrode studs 31N are commonly connected to a negative node 57. One of the U-phase studs 31U is connected to an output node 58 while the other U-phase stud 31U is connected to another output node 59. The high-side power MOSFETs 51 are connected in parallel between the positive node 56 and the output node 58. The low-side power MOSFETs 52 are connected in parallel between the output node 58 and the negative node 57. The high-side power MOSFETs 51 are used for pulling up the U-phase stud 31U connected to the output node 58 while the low-side power MOSFETs 52 are used for pulling down this U-phase stud 31U. The high-side power MOSFETs 53 are connected in parallel between the positive node 56 and an output node 59. The low-side power MOSFETs 54 are connected in parallel between the output node 59 and the negative node 57. The high-side power MOSFETs 53 are used for pulling up the U-phase stud 31U connected to the output node 59 while the low-side power MOSFETs 54 are used for pulling down this U-phase stud 31U. The gates of the high-side power MOSFETs 51 and 53 and the gates of the low-side power MOSFETs 52 and 54 are connected to the U-phase gate drive circuit 17U so as to be driven by the U-phase gate drive circuit 17U.

Referring back to FIG. 11, the high-side power MOSFETs 51 and the low-side power MOSFETs 52 are respectively arranged in line in the positive x-direction. Similarly, the low-side power MOSFETs 53 and the low-side power MOSFETs 54 are respectively arranged in line in the positive x-direction.

To balancedly achieve both reduction in the area required for arranging the power FETs and the studs, and uniformity in the currents through the power FETs, it is further preferable that the circuit layout of the IMS boards 11U be determined such that the relative positions of the positive electrode studs 31P with respect to the high-side power MOSFETs 51 and the relative positions of the U-phase studs 31U with respect to the low-side power MOSFETs 52 are located alternately to each other. More specifically, the positive electrode studs 31P are so arranged as to be positioned in the negative x-direction from the row of the high-side power MOSFETs 51, while the U-phase studs 31U are so arranged as to be positioned in the positive x-direction from the row of the low-side power MOSFETs 52. The negative electrode studs 31N are positioned in the negative y-direction with respect to the row of the high-side power MOSFETs 51 and the row of the low-side power MOSFETs 52. Such arrangement permits the lengths of interconnections between the positive electrode studs 31P and the U-phase studs 31U to be substantially identical regardless of the high-side power MOSFETs 51 located therebetween, thus improving in the uniformity of the currents through the high-side power MOSFETs 51. In addition, positioning the U-phase studs 31U in the positive x-direction with respect to the row of the low-side power MOSFETs 52 permits a reduction in the area required for arranging the power FETs and the studs.

To uniform the currents through the power FETs and the current outputted from the two U-phase studs 31U, it is further preferable that the circuit layout of the IMS board 11 be mirror symmetric with respect to a given symmetry plane S. More specifically, the row of the high-side power MOSFETs 51 and the row of the high-side power MOSFETs 53 are arranged mirror-symmetrically with respect to the symmetry plane S. Additionally, the row of the low-side power MOSFETs 52 and the row of the low-side power MOSFETs 54 are arranged mirror-symmetrically with respect to the symmetry plane S. Furthermore, the two positive electrode studs 31P are arranged mirror-symmetrically with respect to the symmetry plane S, and the two U-phase studs 31U are arranged mirror-symmetrically with respect to the symmetry plane S. The two negative electrode studs 31N are also arranged mirror-symmetrically with respect to the symmetry plane S. More specifically, the negative electrode studs 31N are arranged so that the center axes of the cylindrical body portions 31a are located on the symmetry plane S. Such arrangement effectively improves the uniformity of the currents through the power FETs and the currents outputted from the two U-phase studs 31U.

It should be noted that the positions where the positive electrode studs 31P are arranged and the positions where the negative electrode studs 31N are arranged are interchangeable. When the positions where the positive electrode studs 31P are arranged and the positions where the negative electrode studs 31N are arranged are interchanged, the position where the row of the high-side power MOSFETs 51 is arranged and the position where the row of the low-side power MOSFETs 52 is arranged are interchanged. Further, the position where the row of the high-side power MOSFETs 53 is arranged and the position where the row of the low-side power MOSFETs 54 is arranged are interchanged. It is obvious to those skilled in the art that the same effects can be provided with such layout.

It is apparent that the present invention is not limited to the above-described embodiments, which may be modified and changed without departing from the scope of the invention.

What is claimed is:

1. An inverter apparatus comprising:
   an insulated metal substrate on which an inverter output stage is mounted;
   a conductive stud coupled to a main surface of said insulated metal substrate, and electrically connected with said inverter output stage;
   a printed circuit board supported by said stud and having rear and main surfaces, wherein said stud is coupled on said rear surface, and a circuit connected to said inverter output stage is provided on said main surface;
   a conductive spacer coupled to said main surface of said printed circuit board, and electrically connected with said stud; and
   a bus bar coupled to said spacer.

2. The inverter apparatus according to claim 1, wherein said bus bar is formed of annealed copper.

3. The inverter apparatus according to claim 1, further comprising:
   a base plate on which said insulated metal substrate is provided;
   an electrode terminal fixed to said base plate,
   wherein said electrode terminal includes:
     an insulating spacer fixed to said base plate;
     a bolt fixed to said insulating spacer;
     a conductive terminal spacer through which said bolt is inserted; and
     a nut through which said bolt is inserted for securing a terminal of a cable between said nut and said terminal spacer.

4. The inverter apparatus according to claim 3, further comprising a rotation-preventive fitting preventing rotation of said terminal spacer around said bolt,
   wherein said bus bar is formed of annealed copper.

5. The inverter apparatus according to claim 4, further comprising a cover in which said insulated metal substrate and said printed circuit board are housed,
   wherein said rotation-preventive fitting is disposed between said nut and said terminal spacer, and engaged with said cover.

6. The inverter apparatus according to claim 1, wherein said stud is coupled with said insulated metal substrate through soldering, and
   wherein a coupling face between said stud and said insulated metal substrate is circular.

7. The inverter apparatus according to claim 6, wherein said stud includes a cylindrical body portion coupled to said insulated metal substrate, and
   wherein said body portion has a diameter of 10 mm or less.

8. The inverter apparatus according to claim 7, wherein said body portion has a height of 12 mm or less.

9. The inverter apparatus according to claim 1, wherein said stud is coupled to said insulated metal substrate through soldering, and
   wherein said stud has a cavity open into said coupling face between said stud and said insulated metal substrate.

10. The inverter apparatus according to claim 1, wherein said stud and said spacer are mechanically coupled using threads with said printed circuit board sandwiched therebetween.

11. An IMS board receiving a power supply level and a ground level to develop a voltage associated with one phase of a three-phase AC voltage, comprising:
    an insulated metal substrate;
    a first stud provided on said insulated metal substrate to receive one of said power supply and ground levels;
    a second stud provided on said insulated metal substrate to output said voltage associated with said one phase;
    at least one third stud provided on said insulted metal substrate to receive another of said power supply and ground levels;
    a plurality of first power transistors connected in parallel between said first and second studs; and
    a plurality of second power transistors connected in parallel between said second stud and said at least one third stud,
    wherein said plurality of first power transistors are arranged in line in a first direction,
    wherein said plurality of second power transistors are arranged in line in said first direction,
    wherein said first stud is positioned at a position away from a line of said plurality of first power transistors in said first direction,
    wherein said second stud is positioned at a position away from a line of said plurality of second power transistors in a second direction opposite to said first direction, and
    wherein said at least one third stud is positioned at a position away from said lines of said first and second power transistors in a third direction orthogonal to said first direction.

12. The IMS board according to claim 11, further comprising:
    a fourth stud provided on said insulated metal substrate to receive said one of said power supply and ground levels;
    a fifth stud provided on said insulated metal substrate to output said voltage associated with said one phase;
    a plurality of third power transistors connected in parallel between said fourth and fifth studs, and having the same conductivity type as said plurality of first power transistors; and
    a plurality of fourth power transistors connected in parallel between said at least one third stud and said fifth stud, and having the same conductivity type as said plurality of second power transistors,
    wherein said first and fourth studs are arranged mirror-symmetrically with respect to a certain symmetry plane,
    wherein said second and fifth studs are arranged mirror-symmetrically with respect to said symmetry plane,
    wherein said pluralities of first and third power transistors are arranged mirror-symmetrically with respect to said symmetry plane,
    wherein said pluralities of second and fourth power transistors are arranged mirror-symmetrically with respect to said symmetry plane, and
    wherein said at least one third stud is arranged mirror-symmetrically with respect to said symmetry plane.

* * * * *